United States Patent [19]

Chang et al.

[11] Patent Number: 5,500,818
[45] Date of Patent: Mar. 19, 1996

[54] METHOD AND APPARATUS FOR PROVIDING ACCURATE T(ON) AND T(OFF) TIMES FOR THE OUTPUT OF A MEMORY ARRAY

[75] Inventors: Shuen C. Chang, San Jose; Hai D. Ho, Milpitas; Szu C. Sun, Mountain View, all of Calif.

[73] Assignees: Sun Microsystems, Inc., Mountain View; Samsung Semiconductor, Inc., San Jose, both of Calif.

[21] Appl. No.: 145,373

[22] Filed: Oct. 29, 1993

[51] Int. Cl.$^6$ .................................................. G11C 7/00
[52] U.S. Cl. ...................... 365/189.05; 365/194; 327/263
[58] Field of Search ............................ 365/189.05, 194; 327/285, 288, 263, 264; 326/58; 345/189

[56] References Cited

U.S. PATENT DOCUMENTS

| | | | |
|---|---|---|---|
| 4,661,928 | 4/1987 | Yasuoka | 365/189.05 |
| 4,802,127 | 1/1989 | Akaogi et al. | 365/189.05 |
| 4,833,657 | 5/1989 | Tanaka | 365/189.05 X |
| 5,130,564 | 7/1992 | Sin | 327/264 |
| 5,164,621 | 11/1992 | Miyamoto | 327/264 |
| 5,313,422 | 5/1994 | Houston | 365/194 |

FOREIGN PATENT DOCUMENTS

| | | | |
|---|---|---|---|
| 404159692 | 6/1992 | Japan | 365/194 |

*Primary Examiner*—David C. Nelms
*Assistant Examiner*—Son Dinh
*Attorney, Agent, or Firm*—Blakely Sokoloff Taylor & Zafman

[57] ABSTRACT

A frame buffer including an array of memory cells, circuitry for accessing the memory cells to derive selected pixel data, and output circuitry for providing data signals at an output port, the output circuitry including circuitry for determining the precise time required for a data signal to rise and fall at the output port, such circuitry being selected to provide the minimum delay between succeeding data signals at the output port.

20 Claims, 6 Drawing Sheets

METHOD AND APPARATUS FOR PROVIDING ACCURATE T(ON) AND T(OFF) TIMES FOR THE OUTPUT OF A MEMORY ARRAY

BACKGROUND OF THE INVENTION

1. Field of the Invention

This invention relates to computer systems and, more particularly, to a method and apparatus for producing accurate measurements of the time required to turn on and to turn off a data signal at the output of a memory array or other component circuit.

2. History of the Prior Art

One of the significant problems involved in increasing the operational speed of desktop computers has been in finding ways to increase the rate at which information is transferred to an output display device. Many of the various forms of data presentation which are presently available require that copious amounts of data be transferred. For example, if a computer output display monitor is operating in a color mode in which 1024×780 pixels are displayed on the screen at once and the mode is one in which thirty-two bits are used to define each pixel, then a total of over twenty-five millions bits of information must be transferred to the screen for each individual picture (called a "frame") that is displayed. Typically, sixty frames are displayed each second so that over one and one-half billion bits must be transferred each second in such a system. This requires a very substantial amount of processing power.

In order to transfer such a large amount of information to an output display device, computer systems typically utilize a frame buffer which holds the pixel data which is to be displayed on the output display. Typically a frame buffer offers a sufficient amount of dynamic random access memory (DRAM) to store one frame of data to be displayed. The information in the frame buffer is transferred to the display from the frame buffer sixty or more times each second. After (or during) each transfer, the pixel data in the frame buffer is updated with the new information to be displayed in the next frame.

It will be understood by those skilled in the art that when so much data is being constantly transferred to and from the frame buffer memory array, that very small changes in the time required to send or receive any individual bit of data will affect greatly the speed at which a frame of data may be transferred.

First, transferring the data to and from the frame buffer is relatively slow process compared to other computer processes because of the manner in which frame buffers are constructed. For this reason, various improvements have been made to speed access in frame buffers. For example, two-ported video random access memory (VRAM) has been substituted for dynamic random access memory so that information may be transferred from the frame buffer to the display at the same time other information is being loaded into the frame buffer.

One of the problems of all frame buffers is caused by the inability of the manufacturer to measure the time required for the frame buffer circuits to place signals on the data bus. For example, if a first signal is to be transferred from one output terminal of the frame buffer to a conductor of the system bus, a second signal from a second output terminal of the frame buffer cannot be sent to that conductor of the bus until the first signal is complete. Such a situation occurs at the sense amplifier output terminals of a frame buffer when first one output driver and then another output driver are switched to any one conductor of the bus. As those skilled in the art understand, although the length of a data signal is apparently controlled by the length of time a particular output terminal is enabled, each circuit through which a data signal passes includes some delay which affects that signal. Thus, some additional finite time is required for a signal placed on the bus to rise from a zero value to its full value; and some other additional finite time is required for that signal on the bus to fall to a zero value when terminated. It is often very difficult to determine the beginning and the ending of any particular signal because of the shapes of the wave forms of those signals. Unless the times required for the rise and fall of the signals (so called T(on) and T(off) values) are known accurately, the first and second signals may overlap one another and distort the data content. Because the exact point at which a data signal which has been asserted begins to fall is very difficult to determine accurately, some arbitrary delay is typically placed in the circuitry in order to eliminate signal overlapping. If a particular frame buffer circuit has a synchronous interface to the bus circuitry, the delay must be at least one clock cycle. With an asynchronous interface, the delay may be less. In any case, such a delay must be inserted between each set of individual signals; consequently, this delay is compounded many times over in each operation related to a frame buffer. Thus, the insertion of such a delay drastically reduces the speed of operation of such a frame buffer.

SUMMARY OF THE INVENTION

It is, therefore, an object of the present invention to provide a new method for determining the turn-on and turn-off times of data signals provided by a frame buffer.

It is also an object of the present invention to provide a new design of circuitry for providing output from a frame buffer.

It is another object of the present invention to provide circuitry for accurately determining the delay required to turn on and turn off data signals at the output of a component circuit of a computer system.

It is another more specific object of the present invention to provide circuitry for accurately controlling and shortening the delay required to turn on and turn off data signals provided by a frame buffer.

These and other objects of the present invention are realized in a frame buffer including an array of memory cells, circuitry for accessing the memory cells to derive selected pixel data, and output circuitry for providing data signals at an output port, the output circuitry including circuitry for determining the precise time required for a data signal to rise and fall at the output port, such circuitry being selected to provide the minimum delay between succeeding data signals at the output port.

These and other objects and features of the invention will be better understood by reference to the detailed description which follows taken together with the drawings in which like elements are referred to by like designations throughout the several views.

BRIEF DESCRIPTION OF THE DRAWINGS

FIG. 2b is a timing diagram illustrating signals utilized in the circuit of FIG. 2a.

FIG. 3b is a timing diagram illustrating signals utilized in the circuit of FIG. 3a.

FIG. 4a is a partially-block partially-circuit diagram illustrating a specific portion of the circuit arrangement of FIG. 3a.

FIG. 4b is a timing diagram illustrating signals utilized in the circuit of FIG. 4a.

FIG. 5 is a circuit diagram illustrating a portion of the circuit of FIG. 3a.

NOTATION AND NOMENCLATURE

Some portions of the detailed descriptions which follow are presented in terms of symbolic representations of operations on data bits within a computer memory. These descriptions and representations are the means used by those skilled in the data processing arts to most effectively convey the substance of their work to others skilled in the art. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities.

Further, the manipulations performed are often referred to in terms, such as adding or comparing, which are commonly associated with mental operations performed by a human operator. No such capability of a human operator is necessary or desirable in most cases in any of the operations described herein which form part of the present invention; the operations are machine operations. Useful machines for performing the operations of the present invention include general purpose digital computers or other similar devices. In all cases the distinction between the method operations in operating a computer and the method of computation itself should be borne in mind. The present invention relates to a method and apparatus for operating a computer in processing electrical or other (e.g. mechanical, chemical) physical signals to generate other desired physical signals.

DETAILED DESCRIPTION OF THE INVENTION

Figure 1:
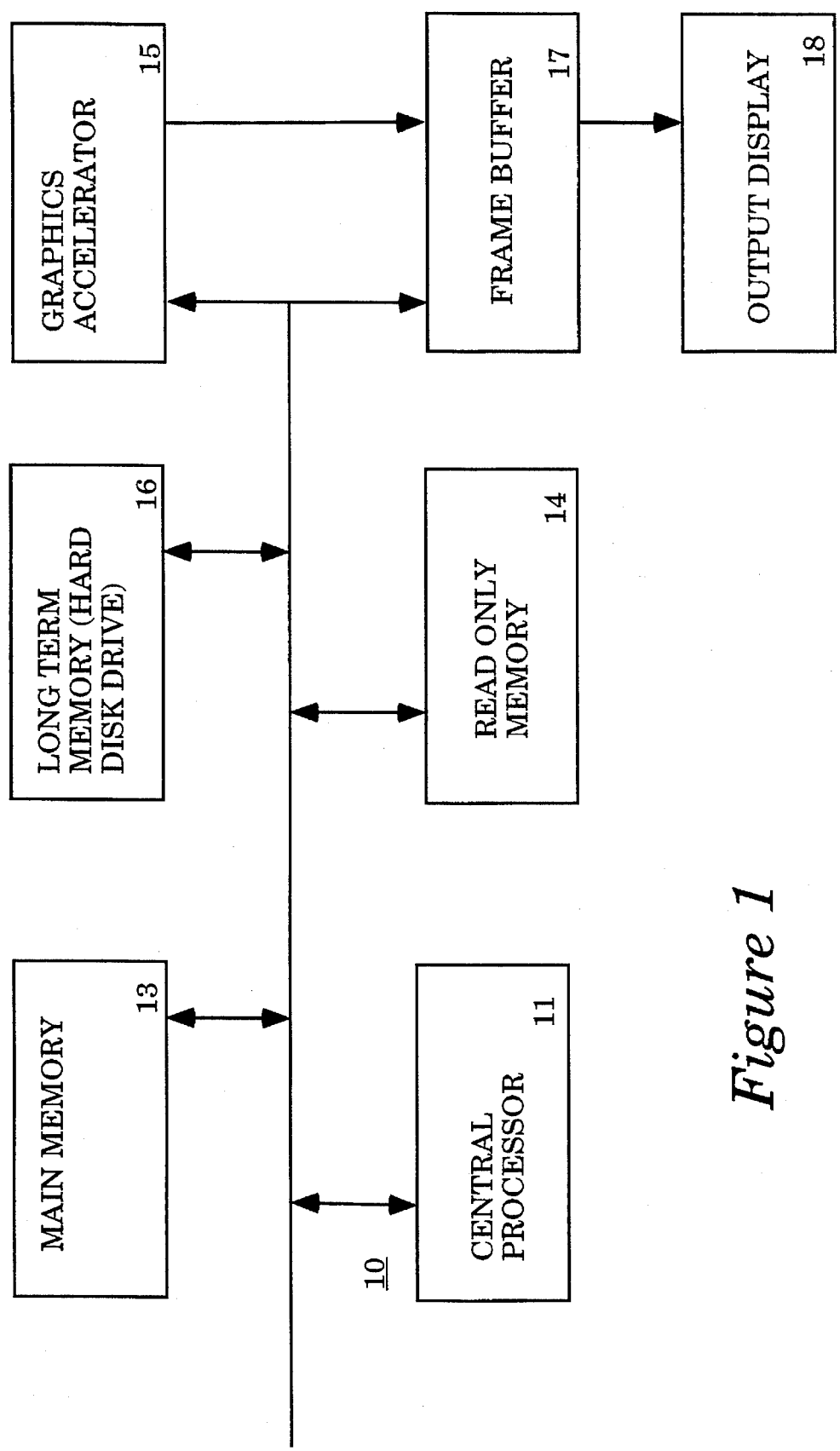
FIG. 1 is a block diagram illustrating a computer system which may include the present invention.

Referring now to FIG. 1, there is illustrated a computer system 10. The system 10 includes a central processor 11 which carries out the various instructions provided to the computer 10 for its operations. The central processor 11 is joined to a bus 12 adapted to carry information to various components of the system 10. Also connected to the bus 12 is main memory 13 which is typically constructed of dynamic random access memory arranged in a manner well known to those skilled in the prior art to store information being used by the central processor during the period in which power is provided to the system 10. A read only memory 14 which may include various memory devices (such as electrically programmable read only memory devices (EPROM)) well known to those skilled in the art each of which is adapted to retain a memory condition in the absence of power to the system 10. The read only memory 14 typically stores various basic functions used by the processor 11 such as basic input/output and startup processes.

Also connected to the bus 12 are various peripheral components such as long term memory 16. The construction and operation of long term memory 16 (typically an electro-mechanical hard disk drive) are well known to those skilled in the art. Also coupled to the bus 12 is circuitry such as a frame buffer 17 to which data may be written which is to be transferred to an output device such as a monitor 18 for display. For the purposes of the present explanation, the frame buffer 17 may be considered to include in addition to various memory planes necessary to store information, various circuitry well known to those skilled in the art such as addressing circuitry, sensing amplifiers, color lookup tables (where color indexing is utilized), digital-to-analog converter circuitry, and circuitry for controlling the scan of information to the output display. In addition, the frame buffer 17 may be connected to the bus 12 through circuitry such as graphic accelerating circuit 15 used for providing fast rendering of graphical data to be furnished to the frame buffer 17.

Figure 2A:
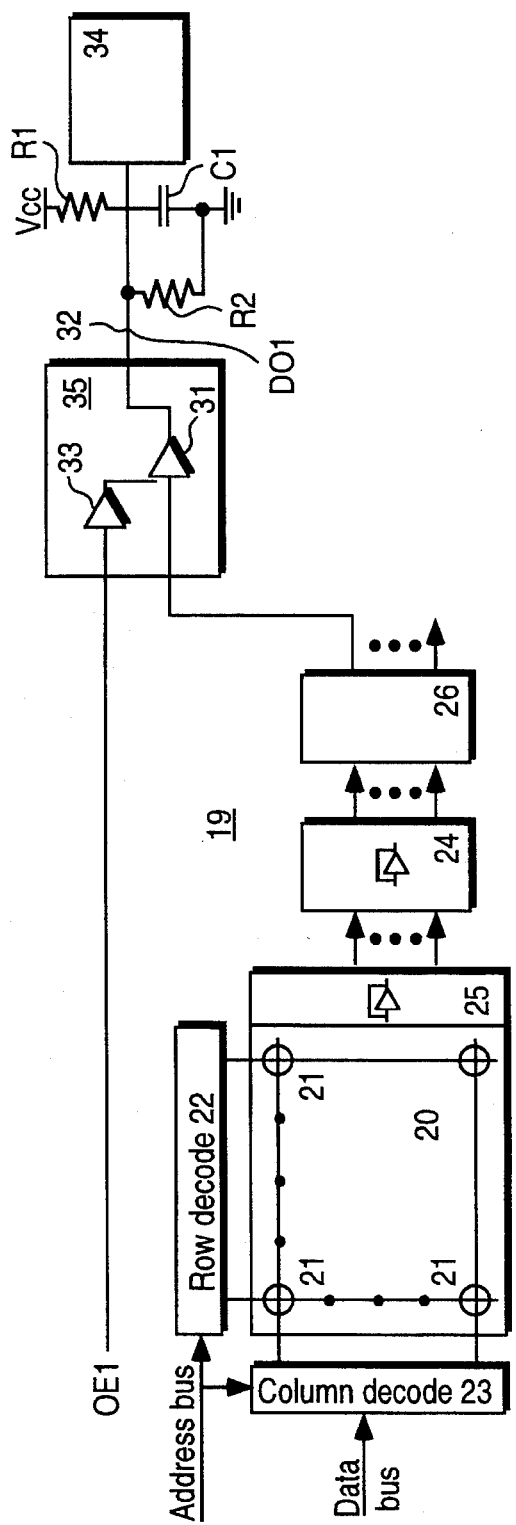
FIG. 2a is a partially-block partially-circuit diagram illustrating a testing arrangement for a portion of a frame buffer designed in accordance with the prior art.

FIG. 2a illustrates a sub-portion 19 of a frame buffer constructed in accordance with the prior art and connected in a manner that it may be tested to determine its characteristics. The sub-portion 19 illustrated is typically manufactured as a single integrated circuit chip, and a number of such chips are combined to provide sufficient memory for an entire frame buffer. Typically, such a sub-portion 19 of a frame buffer (hereinafter referred to as memory 19) includes a dynamic random access memory array 20 designed to store information defining pixels on the output display. Such an array 20 may be designed to provide two ports so that data may be read from the array and transferred to the output display during a period in which information is being written to the array. An array 20 so constructed is referred to as video random access memory or VRAM. For the purpose of explaining this invention, only the circuitry providing the port which connects to the data bus portion of the bus 12 is illustrated.

Typically, pixel data is transferred to the array 20 in a binary pattern on the data bus. In a typical computer system having a thirty-two bit data bus, thirty-two bits of information may be written to the frame buffer memory and appear at thirty-two input pins. This data may define one or more pixels depending upon the number of bits required to define a pixel in the particular mode of operation. This pixel data is transferred to memory addresses within the array 20 from which it may later be retrieved for display. The positions to which the pixel data is transferred within the array are designated by addresses transferred to the array on an address bus.

While the pixel data is transferred to the frame buffer on the data bus portion of the bus 12, the address for that data is transferred on the address bus portion of the bus 12. The address includes a row address portion and a column address portion. These portions of the address are decoded by row and column address decoding circuits 22 and 23, respectively. The selected row and column identify a specific memory cell 21 so that a bit of data may be written to that selected position. If data defining an individual pixel is more than one bit (four, eight, sixteen, or thirty-two bits of color data), then the address typically identifies a plurality of positions within the array 20 (often in individual planes of the array) in which the bits defining one or more pixels are to be stored.

Data stored in the array 20 of the memory 19 may be read and placed on the data bus by addressing the appropriate pixel position using the row and column addresses of the memory cells in the array and providing a read command. Such data may then be utilized within the computer system of which the frame buffer including the memory 19 is a part in accordance with instructions sent by, for example, a central processing unit.

The memory 19 shown FIG. 2a includes an output arrangement by which data may be read from the array 20. Bitline amplifiers 25 are associated with each column of the memory 19, and the one of those bitline amplifiers 25 at an address selected to be read by the decode circuitry transfers data to an output sense amplifier 24 and from there to a data latch 26. The data latch 26 provides data signals to an output circuit 35 for transfer to an output terminal 32. The output circuit 35 includes a tristate buffer 31. The tristate buffer 31 receives an output enable signal OE1 which allows the transfer of the data signal at the output of the latch 26 to the data output terminal 32 from which data may be placed on a conductor of the data bus. The output enable signal OE1 is furnished by a source (not shown in FIG. 2a) which is typically the device controlling the memory 19 (such as a central processing unit 11 or a graphics accelerating circuit 15). This signal OE1 is transferred through a buffer circuit 33 to operate the tristate buffer 31.

In order to measure initially the actual delay of the circuit 33 of FIG. 2a, a manufacturer typically uses test equipment 34 at the output terminal 32. Usually, this test equipment 34 includes a probe which itself provides a capacitance to ground shown in FIG. 2a as C1. Since the measurement by the equipment 34 of the time required to turn off the data signal is taken while the tristate buffer 31 of the output circuitry from the memory 19 is in the off condition and thus exhibiting a high impedance, the capacitance C1 drastically affects the time required for any signal at the output terminal to be deasserted. Consequently, the test equipment 34 distorts the reading obtained and makes it very difficult to determine the time required for the fall of the data signals.

Figure 2B:
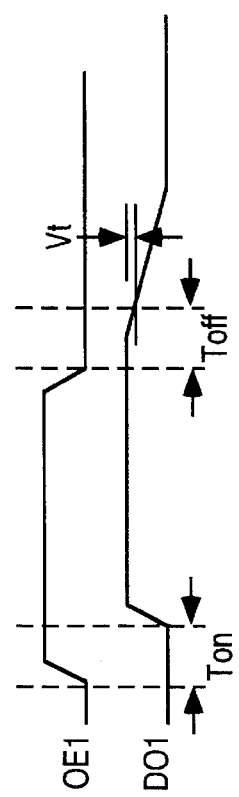

This is illustrated by the data out signal DO1 which is produced at the output terminal 32 (shown in FIG. 2b along with the output enable signal OE1. As may be seen, when the output enable signal OE1 goes positive, a time T(on) commences; the time T(on) ends when the output enable signal delayed through the buffer circuit 33 causes the tristate buffer 31 to transfer the data signal and the leading edge of the data signal DO1 arrives at the output terminal 32 after traversing the buffer 31. Similarly, the time T(off) is measured from the point at which the output enable signal OE1 falls to zero and ends when the data signal DO1 at the output has dropped to a point at which it can be considered to be zero.

As may be seen in FIG. 2b, the value of the capacitance C1 drastically affects the time constant at the output terminal 32 when the tristate device 31 is off and thus the slope of the curve as the data signal turns off. As a practical matter, the capacitance of the test equipment causes the data signal DO1 to drop to zero very slowly. This makes the point at which the asserted signal begins to drop very difficult to determine. Since the extended slope of the curve of the data signal due to the RC constant caused by the test equipment 34 makes the point at which the signal begins to drop to zero and the point at which it actually reaches zero in the absence of the test circuitry very difficult to determine, it has been the practice of the prior art to utilize a resistor R2 in parallel with the capacitance C1 of the equipment 34 to provide a leakage path to ground for the capacitive charge and to measure a value Vt such as 5% of the total voltage drop (or some other specified voltage) and use that to estimate a point at which turn off has occurred.

Figure 2C:
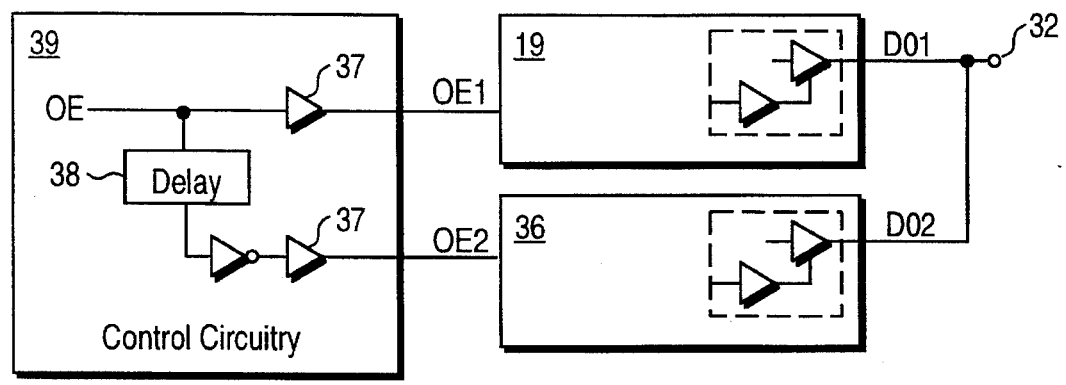
FIG. 2c is a block diagram illustrating the arrangement shown in FIG. 2a in context.
Figure 2D:
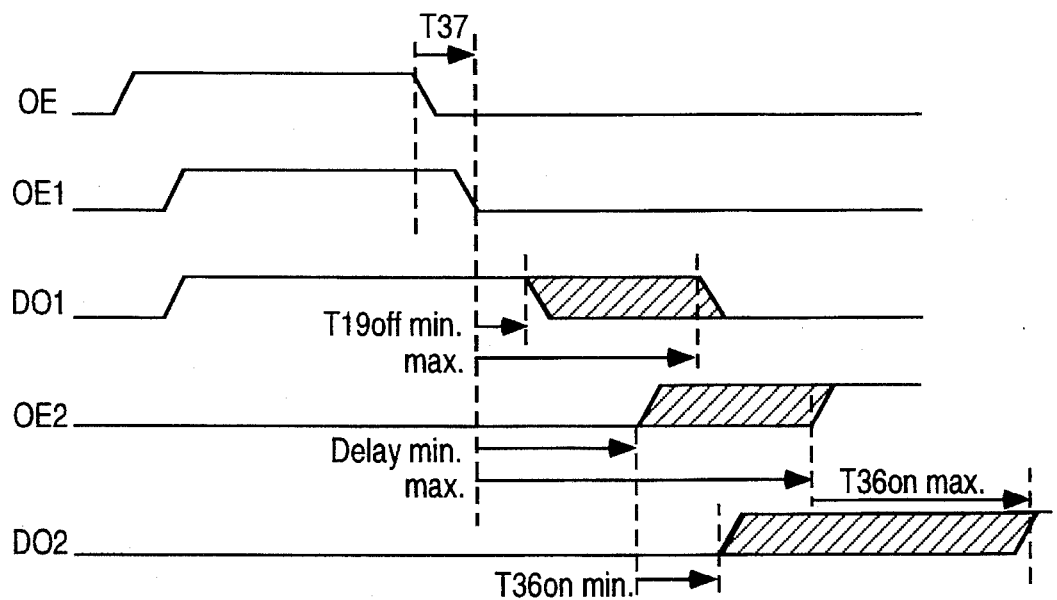
FIG. 2d is a timing diagram illustrating signals utilized in the circuit of FIG. 2c.

As has been described, because of the capacitance of the testing equipment, it is extremely difficult to determine an exact turn off time for the data signal. As has been pointed out above, typically a number of memory chips are connected in an arrangement to provide a frame buffer. A portion of such an arrangement is shown in FIG. 2c. When a second memory chip (memory 36) which is another sub-portion of a frame buffer is connected to a bus conductor at the same terminal 32 and the two memories 19 and 36 are accessed in a typical interleaved serial fashion, there must be a sufficient period between the turn off of the first data signal DO1 at the output of the first memory 19 and the turn on of a second data signal DO2 at the output of the second memory 36 (see FIG. 2d) so that there is no interference between the data signals. This delay must be at least equal to the maximum possible T(off) time period less the minimum possible T(on) period as affected by changes in operating temperature, process, and voltage.

Since a memory chip manufacturer finds it very difficult to measure the delay through memory chips, only a maximum delay is normally specified. Because of this, the manufacture of the control circuitry for providing the enabling signals has a difficult time designing the control circuitry. The accurate computation of the delay depends on the delays in the control circuitry, the delay through the memory 19, and the delay through the memory 36. Because of the difficulty of determining the time T(off), the solution for many designers of control circuitry has been to provide a sufficient amount of arbitrary delay in the control circuitry controlling the operation of the two memories to assure that no overlap of data signals occurs. The designer of the control circuitry can determine the ratio of worst case delay to best case delay for either T(on) or T(off) through such a delay circuit, and he knows the maximum delays through the memories. Using the information available, it can be shown that the delay which must be provided by the control circuitry for an asynchronous interface with the bus must be approximately four or five times the maximum delay through one of the memory circuits 19 or 36. This is a very substantially delay in providing signals and substantially slows the output operation. Because the need to guarantee no overlap of signals from the different memory chips, most designers have been unwilling to provide asynchronous interfaces to the output because the delay is so difficult to ascertain. Consequently, designers have typically only designed synchronous interfaces which require a delay of at least one clock cycle in order to insert a dead cycle which provides the appropriate output timing. It will be recognized that this causes an even more substantial slowing of the output circuitry and, consequently, an even more substantial slowing of the operation of the frame buffer.

On the other hand, if the maximum and minimum delays through the output circuitry of a memory chip could be accurately measured, then the T(on) and T(off) times could be accurately determined and set so that the delay would be equal to T(off, max) less T(on,min). In such a case, the arbitrary delay placed in the control circuitry could be eliminated and memory output circuitry with asynchronous interfaces accurately designed to provide the least delay possible.

Figure 3A:
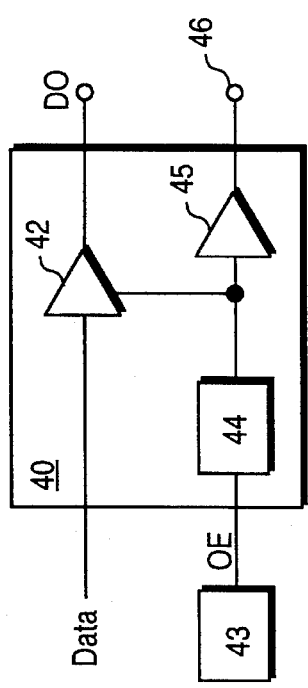
FIG. 3a is a partially-block partially-circuit diagram illustrating a circuit arrangement in accordance with the present invention.

FIG. 3a illustrates in block form an output circuit 40 in accordance with the present invention for precisely determining the exact T(on) and T(off) times of a frame buffer circuit. The circuit 40 may be substituted for the circuit 35 of FIG. 2a. The circuit 40 includes a tristate buffer 42, a delay circuit 44, and an output buffer 45. The circuit 40 receives output enabling signals OE from control circuitry 43 and data signals from sense amplifiers of the frame buffer. An output buffer 45 furnishes signals at an output terminal 46 so that the precise time at which an enable signal arrives may be determined. The output buffer 45 is selected to provide the same circuit delay as the tristate buffer 42. Since the circuit path through the buffer 45 provides a low impedance circuit during measurement at the terminal 46, the capacitive value of the test equipment has little effect on the wave form of the output signal. Thus, the point at which the wave form of the OE signal initially drops and the point at which it becomes zero may be accurately measured. Since the signals transferred through the buffer 45 may be accurately measured, the exact delay offered by the delay circuit 44 may be accurately measured. Once the delay provided by the circuit 44 is accurately measured, it may be accurately established during manufacture to be equal to the difference between the time T(off) maximum less the time T(on) minimum.

Figure 4A:
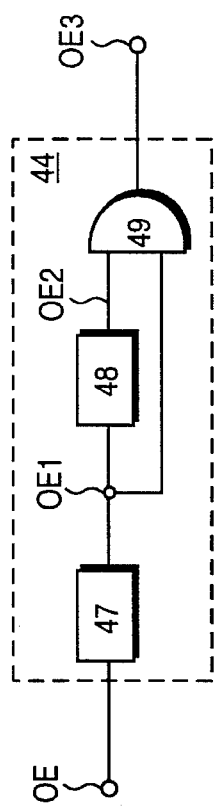
Figure 4B:
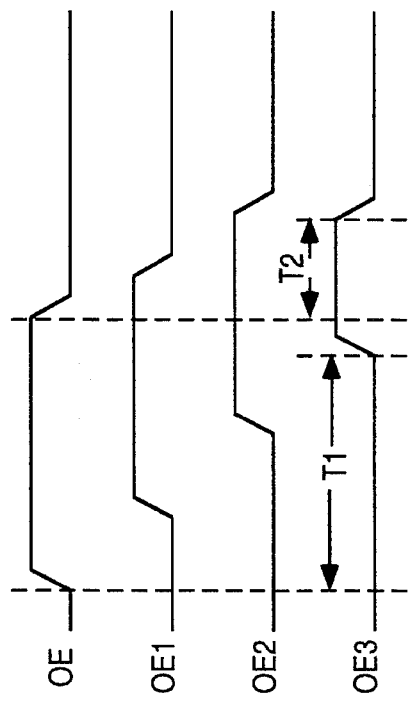

In order to allow the accurate measurement, in one embodiment illustrated in FIG. 4a, the circuit 44 is designed to include a first buffer 47, a delay element 48, and an AND gate 49. FIG. 4b illustrates the different signals which are transferred by the circuit 44. As may be seen, an enabling signal OE is identical to a signal OE1 which appears after a very short delay at the output of the buffer 47. The signal OE1 appears as the signal OE2 at the output of the delay element 48 and at the input to the AND gate 49 after an intentional delay provided by the delay circuit 48. The signal OE1 is also routed around the delay element 48 and furnished to the AND gate 49.

The result of this arrangement is that the output signal from the AND gate 49 commences after the intentional delay provided by the delay element 48 when the delayed enable signal OE2 goes high. On the other hand, the output signal from the AND gate 49 terminates when the signal OE1 drops without waiting for the signal OE2 to drop after the delay through the delay element 48. In FIG. 4b, the time T1 is the time for the leading edge of the enabling signal to traverse the circuit 44 from the node marked OE to the node marked OE3; and the time T2 is the time for the trailing edge of the signal to traverse the circuit 44 from the node marked OE to the node marked OE3. As may be seen from the wave forms in FIG. 4b, the time T1 is equal to the time T2 plus the intentional delay through the delay element 48 because the time T2 does not include the delay through the delay element 48. Because of the lack of capacitive effect, each of the points determining the values of T1 and T2 may be precisely determined at the terminal 46. Since these values may be determined, they may be determined for all temperatures, voltages, and processes.

Figure 3B:
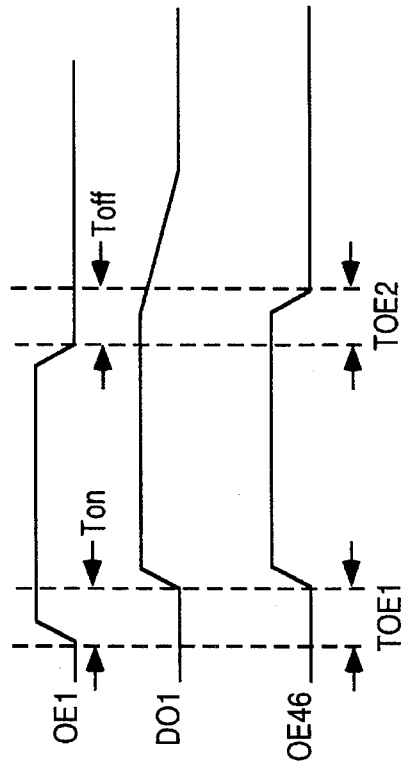

The time T(on) is equal to the time required for the leading edge of the signal OE to traverse the delay circuit 44 and cause the buffer 42 to turn on plus the time for the data signal to traverse the buffer 42. This is equal to the time T1 plus the time through the buffer 42. The time through the circuit 40 from the node OE to the terminal 46 during turnon is equal to the time required for the signal OE to traverse the delay circuit 44 and to traverse the buffer 45. This time (shown as TOE1 in FIG. 3b) is equal to the time T1 plus the time through the buffer 45. Thus the turnon time T(on) may be easily made equal to the time TOE1 through the circuit from the node OE to the terminal 46 by making the value of delay through the buffer 42 equal to the delay through the buffer 45. Since the devices 42 and 45 are part of the same integrated circuit, this may be easily accomplished. In a similar manner, with the values of the delays through the buffers 42 and 45 being equal, the turnoff time T(off) is made equal to the time through the circuit from the node OE to the terminal 46 for the trailing edge of the signal OE (shown as TOE2 in FIG. 3b). With the values of delay through the buffers 42 and 45 equal, the values will stay equal with changes in process and temperature and other circuit variations.

Thus, the value of the delay through the circuit 40 to the data output terminal DO may be measured by determining the start of the signal OE at the node marked OE and the start of the signal OE46 at the terminal 46, and the end of the signal OE at the node marked OE and the end of the signal OE46 at the terminal 46. Subtracting one value from the other provides the intentional delay through the delay element 48. Since the time through the buffer 45 may be made to equal the time through the buffer 42, the values of T (on) and T(off) and the delay through the circuitry may be precisely determined and then controlled by varying the value of the delay through the delay element 48 to be equal to the desired value. Once these values have been determined, the minimum T(on) value is set to be greater than or equal to the maximum T(off) value. This makes the delay exactly a minimum value.

In order to accomplish this, the ratio of T(on,max) to T(on,min) which is equal to the ratio of T(off, max) to T(off, min) is considered to be a value F. It may be shown that for the delay to be a minimum it should be set to equal (F-1) multiplied by T(off). If then the delay through the delay element 48 which is equal to the value T1 minus T2 (and is equal to T(on) minus T(off)) is set to the value (F-1) multiplied by T(off) at any temperature in the process, the minimum delay will be realized. In general, the ratio of worst case to best case delay for the delay element 48 will be approximately 1.8 since the values of the components may be closely controlled in such circuits.

Because both the maximum and minimum delay may be accurately measured, the T(on) and T(off) times can be accurately determined and fixed during design and then measured to insure that the delay will be equal to T(off, max) less T(on,min). In such a case, the arbitrary delay placed in the control circuitry may be eliminated and memory output circuitry with asynchronous interfaces can be accurately designed. Moreover, output circuitry for synchronous interfaces may be designed so that no dead cycle is required.

Figure 5:
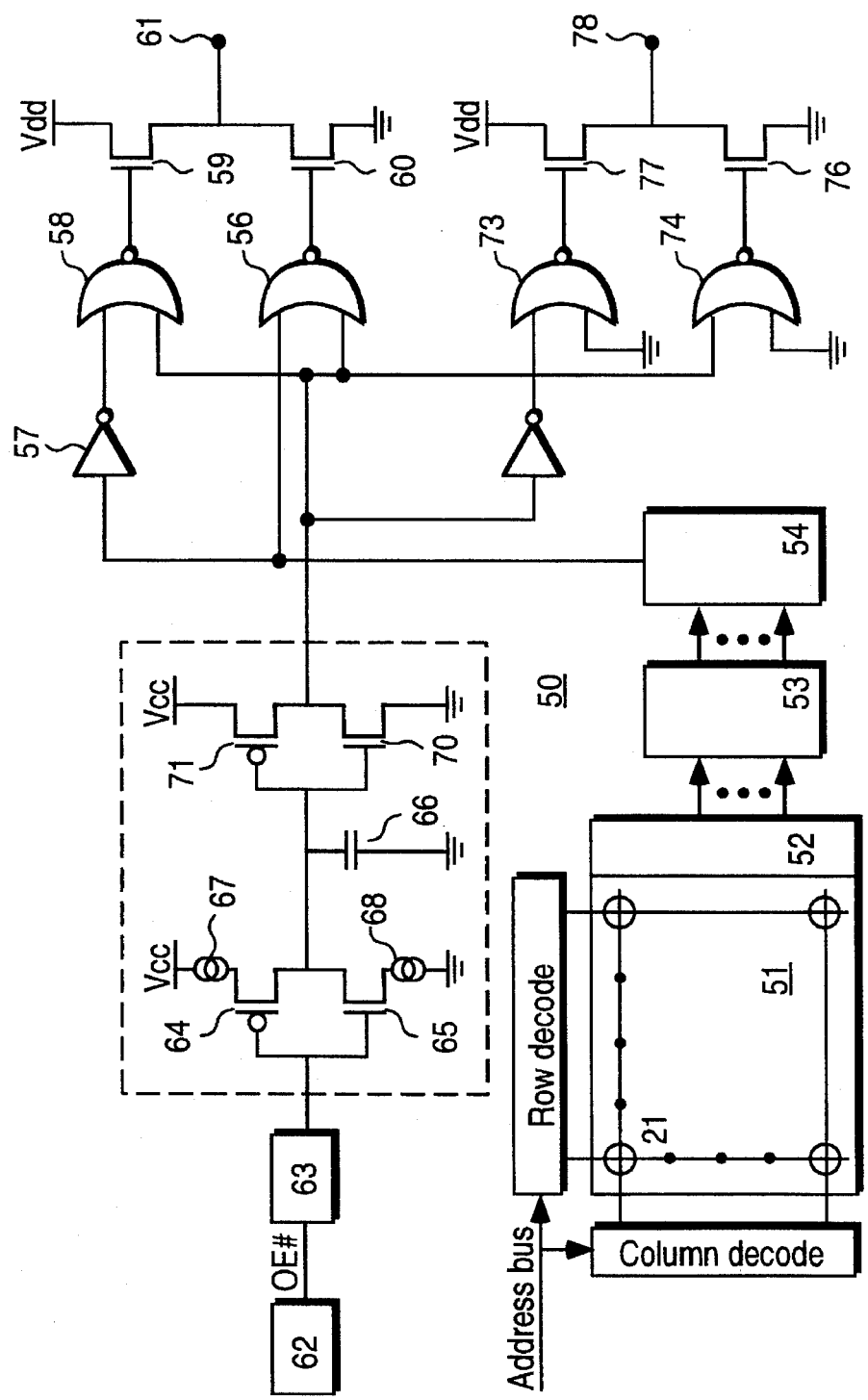
Figure 6:
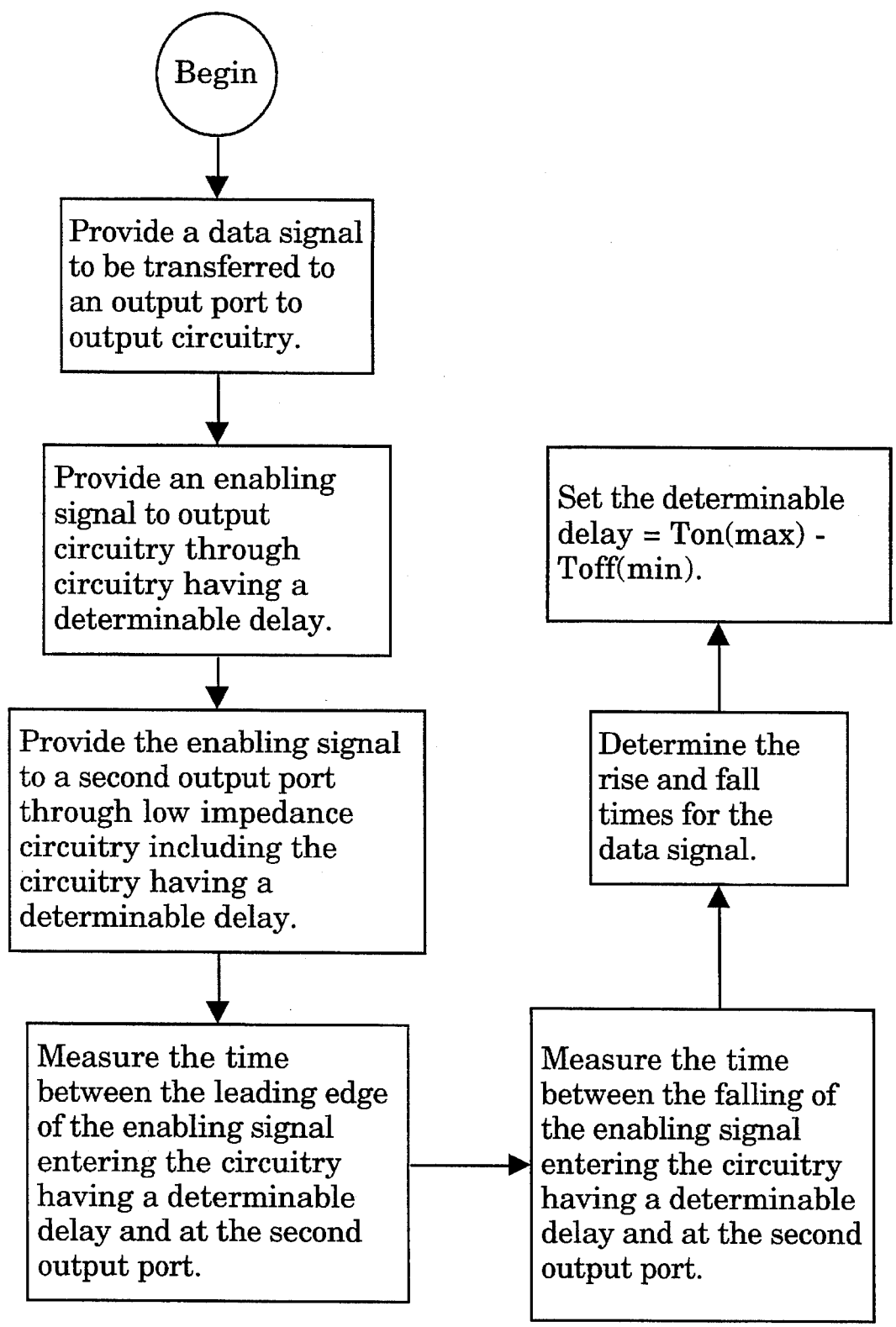
FIG. 6 is a flow chart illustrating a method in accordance with the present invention.

FIG. 5 illustrates a circuit diagram showing a preferred embodiment of the invention. In this circuit 50, a memory array 51 stores data which may be read using column and row addressing circuitry by bitline sense amplifiers 52. The sense amplifiers 53 furnish signals to a data latch 53 which provide signals to output circuitry. The signals from the output data latch 54 are furnished to one input terminal of a NOR gate 56 and through an inverter 57 to one input of another NOR gate 58. The NOR gates function in the manner of the buffer 42 of FIG. 3 in response to enabling signals to cause one of two N channel field effect transistor devices 59 or 60 to conduct and provide an output signal at an output terminal 61. If the data signal provided by the latch 54 is initially negative, this signal and a negative enable signal cause the gate 56 to provide a high valued output and the device 60 to place ground at the output terminal 61. Alternatively, a high valued data signal from the latch 54 is inverted by the inverter 57 and with the negative enable signal causes the device 59 to conduct and place Vdd at the output terminal 61.

The enabling signal is provided by an enabling source 62 as an active negative signal shown as OE#. The signal is transferred by a buffer stage 63 which is equivalent to the buffer 47 illustrated in FIG. 4a. This signal is transferred to the gate terminals of a P channel field effect device 64 and an N channel field effect device 65. If positive, the enabling signal turns on the device 65 and provides a path to ground for discharge of a capacitor 66. If negative, the enabling signal turns on the device 64 and provides a path from a voltage Vcc for charging the capacitor 66. It should be noted that the charging path for the capacitor 66 through the device 64 includes a constant current source 67, while the discharging path for the capacitor 66 through the device 65 includes a constant current source 68. These two sources are varied in accordance with the present invention to provide the appropriate delay of the delay element 48 of FIG. 4a. A charged capacitor 66 causes an N channel field effect device 70 to conduct and provide ground at one terminal of each of the NOR gates 56, 58, and 74. A discharged capacitor turns on a P channel device 71 to applying a disabling signal at one terminal of each of the NOR gates 56, 58, and 74. The signal is also inverted and applied at a terminal of a NOR gate 73. Since each of the NOR gates 73 and 74 has a second input terminal which is grounded and thus held low, the device 70 being on causes a positive output from the NOR gate 74 while the device 71 conducting causes the NOR gate 73 to generate a positive output signal.

As explained above, the enabling signals allow the data signals to be transferred to the output terminal 61. The negative enabling signal also causes the device 76 to conduct and provide ground at an output 15 terminal 78 which is analogous to the terminal 46 of FIG. 3a. A high valued enabling signal causes a P channel device 77 to conduct and provide a high voltage at the output terminal 78.

Thus the circuit 50 provides a terminal 78 at which the measurement of the enabling values may be conducted into a low impedance circuit in the manner explained above with respect to FIGS. 3a and 4a. Utilizing the values measured, the delay may then be set to provide the delay precisely adjusted to be the value described above. The adjustment of the delay is accomplished in the circuit of FIG. 5 by adjusting the rates of current provided by the sources 67 and 68 so that the capacitor 66 charges at a different rate than it discharges. The rate of charging determines the rate at which the device 70 turns on to apply the enabling signal to the NOR gates of the output stages so thus control the time T(on). The rate of discharging determines the rate at which the device 71 turns on to apply the disabling signal to the NOR gates of the output stages so thus controls the time T(off). Both of these rates may be closely controlled using well known circuits and techniques.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. A frame buffer comprising:

an array of memory cells;

access circuitry, coupled to the memory array, for accessing pixel data from a selected memory cell of the array of memory cells and for converting the pixel data into an input data signal; and output circuitry, coupled to the access circuitry, for producing a first output data signal at an output port based on the input data signal, said output circuitry includes control circuitry for controlling a rise time and a fall time of the first output data signal, said control circuitry including a delay circuit being selected to provide a minimum delay between the first output data signal and a second output data signal produced after the first output data signal such that said minimum delay is equal to the difference between a minimum rise time of the second output data signal and a maximum fall time of the first output data signal.

2. The frame buffer as claimed in claim 1, wherein the delay circuit includes an input buffer circuit receiving a first output enable signal and imposing a delay on the first enable signal to produce a second output enable signal;

a delay element receiving the second output enable signal and imposing a predetermined delay on the second output enable signal to produce a third output enable signal; and a logic gate, coupled to the input buffer circuit and the delay element, for producing an enabling signal based on the second and third output enable signals.

3. The frame buffer as claimed in claim 2, wherein the output circuitry further includes a tristate buffer receiving the input data signal and outputting the first output data signal upon receiving an enabling signal from the delay circuit.

4. The frame buffer as claimed in claim 3, wherein the control circuitry further includes an output buffer circuit coupled to receive the enabling signal and provide a second output signal, the output buffer circuit having a delay equivalent to a delay imposed by the tristate buffer.

5. The frame buffer as claimed in claim 1, wherein the delay circuit includes a capacitor;

a first charging circuit for charging the capacitor to a first voltage level in a first time period;

a second charging circuit for discharging the capacitor to a second voltage level in a second time period;

a first switching circuit for providing a signal of a first level in response to the first voltage level on the capacitor; and a second switching circuit for providing a signal of a second level in response to the second voltage level on the capacitor.

6. The frame buffer as claimed in claim 5, wherein the first charging circuit and the second charging circuit include a first constant current source and a second constant current source, respectively.

7. The frame buffer as claimed in claim 5, wherein the first time period is equal to or greater than the second time period.

8. The frame buffer as claimed in claim 7, wherein the output circuitry further includes a first output circuit for providing an output data signal of the first level in response to the signal of the first level from the first switching circuit, when the output data signal is asserted; and a second output circuit for providing an output data signal of the second level in response to the signal of the first level from the second switching circuit, when the output data signal is deasserted.

9. The frame buffer as claimed in claim 8, wherein the output circuitry further includes a third output circuit for providing a test output signal of the first level in response to the signal of the first level from the first switching circuit; and a fourth output circuit for alternatively providing a test output signal of the second level in response to the signal of the second level from the second switching circuit, wherein the third and fourth output circuits provide low impedance paths for measurement of the test output signal.

10. In a computer system including a processor and main memory, said main memory including a memory array comprising:

a plurality of memory cells;

decode circuitry for accessing the plurality of memory cells;

sensing circuitry for providing an input data signal corresponding based on pixel data stored in one of the plurality of memory cells; and output circuitry responsive to an enabling signal for generating a first output data signal based on the input data signal, the output circuitry includes enabling signal delay circuitry including control circuitry imposing a first delay on the enabling signal for turning on the first output data signal and a second delay on the enabling signal for turning off the first output data signal, wherein the first and second delays are selected to (i) provide a minimum delay between the first output data signal and a second output data signal and (ii) eliminate overlapping of the first and second output data signals being transmitted from an output terminal of the output circuitry.

11. The memory array as claimed in claim 10, wherein the control circuitry includes a delay element for producing a delay which is at least equal to the first delay subtracted from the second delay.

12. The memory array as claimed in claim 10, wherein the control circuitry includes a delay element receiving an output enable signal and imposing a predetermined delay on the output enable signal to produce a second output enable signal; and a logic gate, coupled to the delay element, for producing the enabling signal in response to the first and second output enable signals.

13. The memory array as claimed in claim 12, wherein the output circuitry further includes a tristate buffer connected to receive the input data signal and provide the output data signal upon being enabled by the enabling signal.

14. The memory array as claimed in claim 13, wherein the output circuitry further includes a second buffer circuit coupled to receive the enabling signal and provide an output test signal therefrom, the second buffer circuit being constructed to provide a delay approximately equal to the delay imposed by the tristate buffer.

15. The memory array as claimed in claim 10, wherein the control circuitry includes a capacitor;

a first current source for charging the capacitor at a first predetermined rate;

a second current source for discharging the capacitor at a second predetermined rate;

a first switching circuit for providing the enabling signal at a first level in response to a first voltage level on the capacitor; and a second switching circuit for providing the enabling signal at a second level in response to a second voltage level on the capacitor.

16. The memory array as claimed in claim 15, wherein the enabling signal delay circuitry further includes a first output circuit for providing an output data signal of a first level if the first switching circuit provides the enabling signal at the first level; and a second output circuit for providing an output data signal of a second level if the second switching circuit provides the enabling signal at the second level.

17. The memory array as claimed in claim 16, wherein the enabling signal delay circuitry further includes a third output circuit for providing a test output signal of a first level in response to the enabling signal from the first switching circuit; and a fourth output circuit for providing a test output signal of a second level in response to deassertion of the enabling signal by the second output circuit, wherein the third and fourth output circuits provide low impedance paths for measurement of the test output signal.

18. A method of minimizing propagation time between deassertion of a first output data signal and assertion of a second output data signal, subsequent to the first data signal, at a first output terminal of a digital circuit without causing overlap of the first and second output data signals, the method comprising the steps of:

providing a first input data signal to circuitry for enabling the transfer;

providing an enabling signal to the circuitry for enabling the transfer via circuitry having a determinable delay;

providing the enabling signal to a second output terminal through low impedance circuitry including the circuitry having a determinable delay;

measuring a propagation time between a leading edge of the enabling signal entering the circuitry having a determinable delay and the leading edge appearing at the second output terminal;

measuring a propagation time between a falling edge of the enabling signal entering the circuitry having a determinable delay and the falling edge appearing at the second output terminal; and setting the determinable delay to equal the maximum time measured between the falling edge of the enabling signal entering the circuitry having a determinable delay and appearing at the second output terminal and the minimum time between the leading edge of the enabling signal entering the circuitry having a determinable delay and appearing at the second output terminal.

19. A frame buffer comprising:

an array of memory cells;

access circuitry, coupled to the memory array, for accessing pixel data from a selected memory cell of the array of memory cells and converting the pixel data into an input data signal; and output circuitry, coupled to the access circuitry, for producing a first data signal based on the input data signal at an output port of the frame buffer, said output circuitry, selected to impose a minimum delay between the first and second data signals, comprises circuitry for controlling the precise time required for the first and second data signals to rise and fall at the output port, said circuitry includes:
a delay circuit including:
   a capacitor,
   a first charging circuit for charging the capacitor to a first voltage level in a first time period,
   a second charging circuit for discharging the capacitor to a second voltage level in a second time period,
   a first switching circuit for providing a signal of a first level in response to the first voltage level on the capacitor, and
   a second switching circuit for providing a signal of a second level in response to the second voltage level on the capacitor;
a first output circuit for providing a data output signal of the first level in response to the signal of the first level from the first switching circuit and the presence of a data signal;
a second output circuit for providing a data output signal of the second level in response to the signal of the first level from the second switching circuit and the absence of a data signal;
a third output circuit for providing a test output signal of the first level in response to the signal of the first level from the first switching circuit; and
a fourth output circuit for providing a test output signal of the second level in response to the absence of the signal of the first level from the second switching circuit, wherein the third and fourth output circuits providing low impedance paths for measurement of the test output signal.

20. In a computer system including a processor and main memory, said main memory including a memory array comprising:
a plurality of memory cells;
decode circuitry for accessing the plurality of memory cells;
sensing circuitry for providing signals indicative of values stored by the plurality of memory cells; and
output circuitry, responsive to enabling signals, for generating output data signals from the signals indicative of values stored by the plurality of memory cells, the output circuitry includes enabling signal delay circuitry, the enabling signal delay circuitry including:
   circuitry providing a first delay of at least one enabling signal for turning on output data signals and a second delay of the at least one enabling signal for turning off the output data signals, wherein the first and second delays are selected to provide a minimum delay between a first and second data signals at the output while eliminating overlapping of the first and second data signals, said circuitry further includes
   a capacitor,
   a first current source for charging the capacitor at a first predetermined rate,
   a second current source for discharging the capacitor at a second predetermined rate,
   a first output circuit for providing an enabling signal in response to a voltage of a first level on the capacitor,
   a second output circuit for terminating an enabling signal in response to a voltage of a second level on the capacitor,
   a third output circuit for providing a data output signal of a first level in response to the enabling signal from the first output circuit, and
   a fourth output circuit for providing a data output signal of a second level in response to a termination of the enabling signal by the second output circuit.

* * * * *

UNITED STATES PATENT AND TRADEMARK OFFICE
CERTIFICATE OF CORRECTION

PATENT NO. : 5,500,818
DATED : March 19, 1996
INVENTOR(S) : Change et al.

It is certified that error appears in the above-indentified patent and that said Letters Patent is hereby corrected as shown below:

In column 9 at line 39, please delete " 15 ".

Signed and Sealed this

Fifteenth Day of October, 1996

Attest:

BRUCE LEHMAN

Attesting Officer    Commissioner of Patents and Trademarks